United States Patent
Inoue et al.

(10) Patent No.: US 6,329,274 B1
(45) Date of Patent: Dec. 11, 2001

(54) METHOD OF PRODUCING SEMICONDUCTOR DEVICE

(75) Inventors: Naoto Inoue; Kenji Aoki; Takashi Hosaka, all of Tokyo (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 07/995,325

(22) Filed: Dec. 28, 1992

Related U.S. Application Data (63) Continuation of application No. 07/558,459, filed on Jul. 27, 1990, now abandoned.

(30) Foreign Application Priority Data

| Jul. 27, 1989 | (JP) | 1-194748 |
| Jul. 27, 1989 | (JP) | 1-194752 |
| Dec. 6, 1989 | (JP) | 1-318551 |

(51) Int. Cl.[7] ............................................. H01L 21/28
(52) U.S. Cl. ............... 438/561; 438/629; 438/637; 438/642; 438/658
(58) Field of Search ............ 437/89, 100, 184, 437/189, 200; 148/DIG. 25, DIG. 26; 438/558, 561, 563, 637, 629, 642, 658, FOR 349, FOR 352, FOR 353, FOR 320, FOR 324

(56) References Cited

U.S. PATENT DOCUMENTS

| 3,247,032 | * | 4/1966 | Griswold . | |
| 3,265,542 | * | 8/1966 | Hirshun | 437/89 |
| 3,506,508 | * | 4/1970 | Nickl . | |
| 3,820,235 | * | 6/1974 | Gucdman | 437/89 |
| 4,216,037 | * | 8/1980 | Katoda et al. | 437/108 |
| 4,766,091 | * | 8/1988 | Ohioshi et al. | 437/108 |
| 4,791,074 | | 12/1988 | Tsunashima et al. . | |
| 4,855,258 | * | 8/1989 | Allman et al. . | |

FOREIGN PATENT DOCUMENTS

| 1554273 | 12/1965 | (DE) . |
| 3636547 | 4/1987 | (DE) . |
| 3636249 | 7/1987 | (DE) . |
| 60123061 | 7/1985 | (JP) . |

OTHER PUBLICATIONS

Wolf, S., et al, Silicon Processing for the VLSI Era, vol. 1, pp. 264–265, 1986.*
Wolf, S., et al, Silicon Processing for the VLSI Era, vol. 2, pp. 102–103, 117–120, 1990.*
Gong, S., F., et al, "A Metal Oxide...Solid Phase Doping", J. Appl. Phys., 65 (11) , Jun. 1, 1989 pp. 4435–4437.*

* cited by examiner

Primary Examiner—George Fourson
(74) Attorney, Agent, or Firm—Hogan & Hartson, L.L.P.

(57) ABSTRACT

For forming electrical interlayer contact in a semiconductor device, an insulating film is formed on a first electrically conductive layer and then a contact hole is formed in the insulating film to expose a part of the first electroconductive, an activated surface of the exposed part is formed in the contact hole, a gas containing an impurity component is supplied to form an impurity adsorption film on the activated surface, and the contact hole is filled with a second electrically conductive layer which electrically contacts the first layer through the contact hole.

7 Claims, 9 Drawing Sheets

METHOD OF PRODUCING SEMICONDUCTOR DEVICE

This is a continuation of application Ser. No. 07/558,459 filed on Jul. 27, 1990, now abandoned.

BACKGROUND OF THE INVENTION

Field of the Invention

The present invention relates to a method of producing a semiconductor device having a contact hole between different electroconductive layers, and more specifically relates to a method of filling the contact hole with an interposed layer to achieve reduction of contact resistance.

Figure 2A:
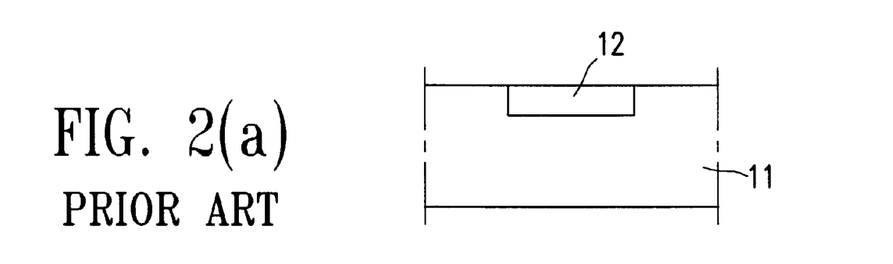
FIGS. 2(a)–2(c) are sectional diagrams illustrative of a step sequence of the conventional method for producing a semiconductor device.
Figure 2B:
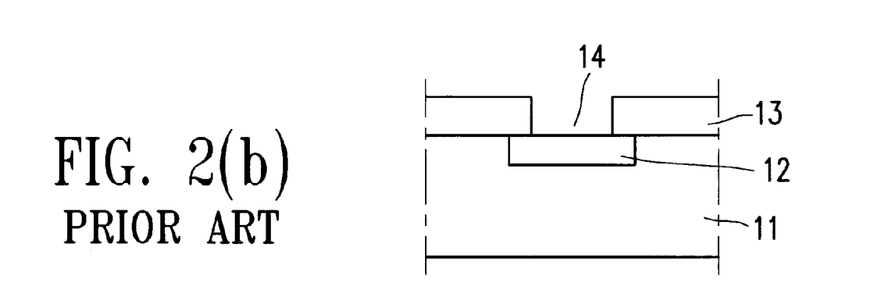
Figure 2C:
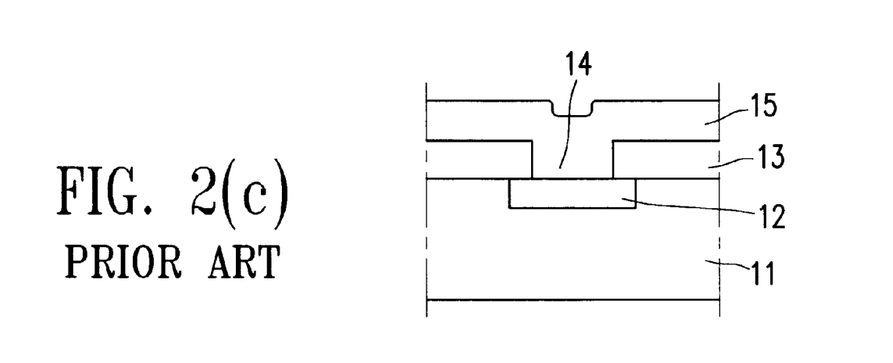

Brief description is firstly given for the conventional method of producing a semiconductor device with reference to FIGS. 2(a)–2(c). In the step of FIG. 2(a), an N type impurity diffusion layer 12 is formed in a silicon substrate 11. In the step of FIG. 2(b), a contact hole 14 is formed in an insulating film 13 disposed over the substrate 11. Thereafter, the step of FIG. 2(c) is carried out to form a lead pattern layer 15 composed of aluminum, silicide or high-melting-temperature metal.

In the conventional semiconductor device of sub-micron scale, depth of the impurity diffusion layer 12 shown in FIG. 2(a) is controlled less than 0.4 μm, thereby causing a defect called an alloy spike under the lead pattern 15 made of aluminum in the contact hole 14, which tends to reduce the junction breakdown voltage of the impurity diffusion layer 12. Further, in case that the lead pattern layer 15 is made of silicide or high-melting-temperature metal, the impurity concentration is decreased at the junction of impurity diffusion layer 12 of silicon in the contact hole 14, thereby increasing contact resistance between the lead pattern layer 15 and the impurity diffusion layer 12.

Figure 10:
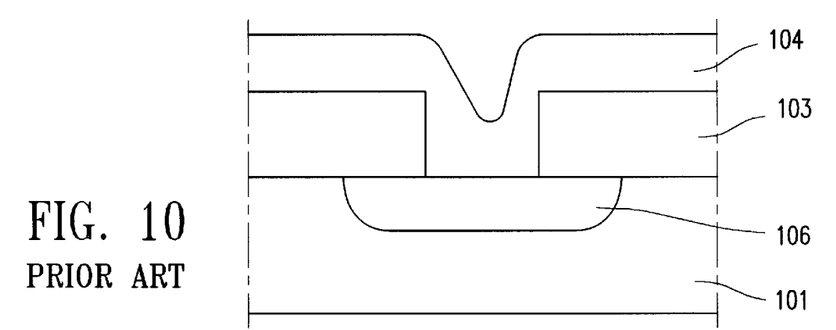
FIG. 10 is a sectional view showing contact structure between a low resistivity region and a metal region in the conventional semiconductor device.

FIG. 10 is a sectional view showing one example of the conventional contact structure between a low resistivity region and a metal lead electrode in an insulating gate field effect transistor. A $P^+$ type drain or source region 101 is formed in a semiconductor substrate 106 by ion implantation. A contact hole is formed in a field insulating film 103. Thereafter, a metal electrode 104 composed, for example, of aluminum is formed to define a drain electrode or source electrode.

Figure 11:
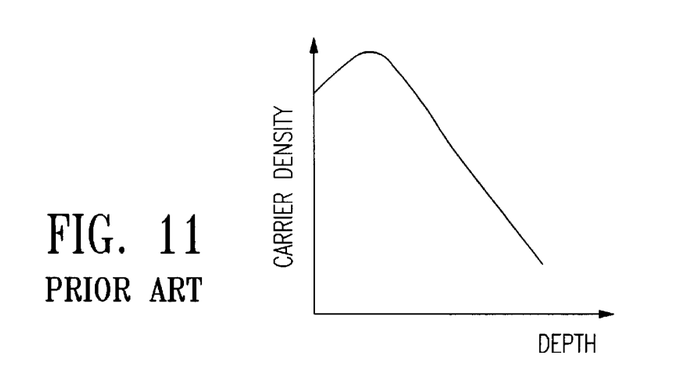
FIG. 11 is a graph showing a carrier density of the low resistivity region of the semiconductor device in the depth direction.

In the above described prior art construction, impurity diffusion is carried out by ion implantation to form $P^+$ type region. As shown in FIG. 11, in the impurity diffusion by the ion implantation, the activated carrier density is decreased on the surface of the substrate, thereby causing increase in the contact resistance with respect to the metal electrode. In addition, damage may be disadvantageously caused on the substrate surface layer due to the ion implantation. Further, aspect ratio of a step portion in a contact hole may be increased when an opening area of the contact hole is reduced for more efficient integration of transistor circuits, thereby causing opening of the metal lead pattern layer and causing defects due to electromigration at a contact hole edge and due to stress-migration.

SUMMARY OF THE INVENTION

In view of the above noted drawbacks of the prior art, an object of the invention is to produce a semiconductor device in which a surface impurity concentration is increased on the impurity diffusion layer or first electroconductive layer formed in the substrate so as to decrease the contact resistance relative to the lead pattern layer or second electroconductive layer.

In order to realize the above noted object, the inventive method of producing a semiconductor device is comprised of the first step of forming an insulating film on a first electroconductive layer and then forming a contact hole to expose a part of the first electroconductive layer, the second step of forming an activated surface of the exposed part in the contact hole, the third step of applying to the activated surface a gas containing an impurity component to form an impurity adsorption film, and the fourth step of filling the contact hole with a second electroconductive layer.

In a preferred form, annealing may be carried out after the third or fourth step to form an impurity-doped sub-layer in the first electroconductive layer.

Further, in case that the second electroconductive layer is composed of silicide of high-melting-temperature metal such as tungsten silicide, another impurity adsorption layer is formed on the second electroconductive layer and then is annealed to dope the impurity into the silicide of high-melting-temperature metal to thereby reduce resistivity of the second electroconductive layer.

A layer containing impurity doped from the impurity adsorption film has a quite high surface impurity concentration more than $10^{70}/cm^3$ and can be provided in a great doping depth, thereby eliminating the defect of increase in the contact resistance due to the alloy spike or due to reduction of the surface concentration.

DETAILED DESCRIPTION OF PREFERRED EMBODIMENTS

A first embodiment of the present invention is described in conjunction with FIGS. 1(a)–1(e). In the FIG. 1(a) step, a silicon semiconductor substrate 1 has formed therein an impurity diffusion region 2. The diffusion region 2 contains an N type impurity or a P type impurity such as boron.

Figure 1A:
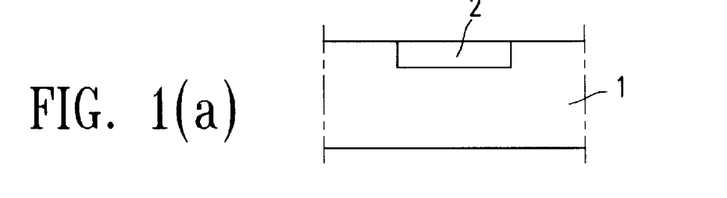
FIGS. 1(a)–1(e) are sectional diagrams illustrative of a step sequence of the method of producing a semiconductor device according to the invention.
Figure 1B:
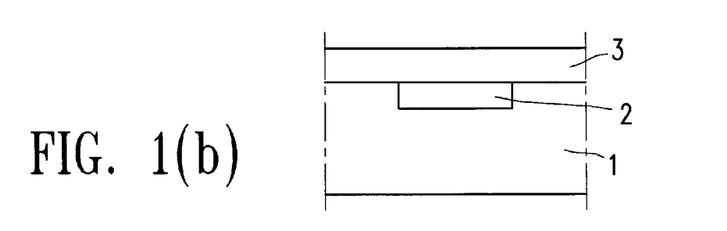

In the next step of FIG. 1(b), an insulating film 3 is formed over the substrate. This insulating film 3 may be formed prior to the formation of impurity diffusion region 2.

Figure 1C:
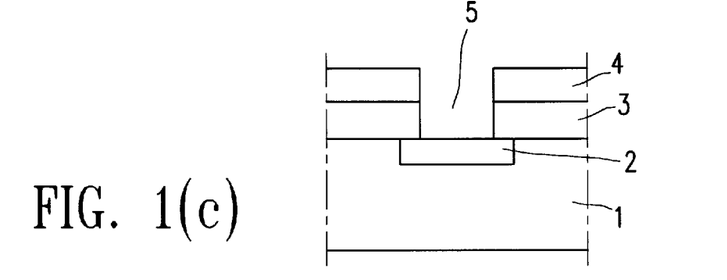

In the FIG. 1(c) step, a photoresist film 4 is coated over the insulating film 3 and is then patterned to define an opening. The insulating film 3 is etched using the photoresist film 4 as a mask to form a contact hole 5 to thereby expose selectively a part of the impurity diffusion region 2.

Figure 1D:
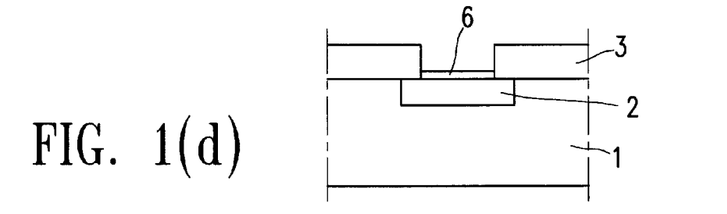

Next in the FIG. 1(d) step, after removing the photoresist film 4, an impurity adsorption film 6 is deposited in the contact hole. This impurity adsorption film 6 is formed according to the following process. Namely, a wafer of the substrate 1 is disposed within a reaction chamber which is held at a temperature of 600–900° C., and then a compound gas containing an impurity is introduced into the chamber to form the impurity adsorption film 6 on the impurity diffusion region 2. For example, when forming the N type adsorption film, the chamber is charged with a gas containing N type element, such as arsine ($AsH_3$), phosphine ($PH_3$), phosphorous trichloride $PCl_3$, arsenic triflouride($AsF_3$) or phosphorus pentafluoride ($PF_3$). When forming a P type adsorption film, the chamber is charged with a gas containing a P type element, such as diborane ($B_2H_6$), trichloroboron ($BCl_3$) or trifluoroboron ($BF_3$). The reaction pressure may be set high above 1 atm or may be reduced below 1 atm. Moreover, after forming the impurity adsorption film, the chamber can be charged with another gas containing a semiconductor element such as silane ($SiH_4$), disilane($Si_2H_6$), dichlorosilane ($SiH_2Cl_2$) or trichlorosilane($SiHCl_3$), so as to grow an epitaxial silicon film. Prior to forming the impurity adsorption film 6, in order to remove a natural oxide film from the surface of the impurity diffusion region 2 in the contact hole, the chamber is held at an ambient temperature of 600–1000° C. and is then charged with a reactive gas such as hydrogen ($H_2$) or hydrogen chloride(HCl) so as to effect gas-phase etching to activate the exposed surface of the impurity diffusion region 2. Further, after forming the impurity adsorption film 6, a thermal process is effected to dope an impurity into the impurity diffusion region 2 to a desired depth.

Figure 1E:
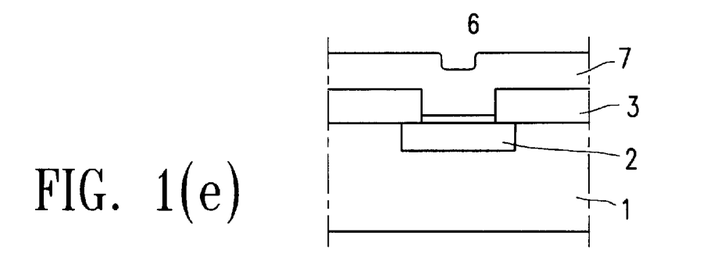

Lastly in the FIG. 1(e) step, a lead pattern layer 7 is formed over the substrate to fill the contact hole so as to form electrical contact between a first electroconductive layer in the form of impurity diffusion region 2 and a second electroconductive layer formed by layer 7. Layer 7 is formed of high-melting-temperature metals such as tungsten(W) and molybdenum(Mo), other metals such as copper(Cu), gold(Au) and silver(Ag), or metal suicides such as tungsten silicide($WSi_2$), molybdenum silicide($MoSi_2$) and titanium silicide($TiSi_2$).

The impurity adsorption film 6 shown in FIGS. 1(d) and 1(e) has a thickness of less than 1000 Å, the thickness being closely controlled. Further, the impurity can be doped to an extremely shallow depth in impurity diffusion region 2. In addition, the impurity can be heavily doped into an interposed silicon epitaxial layer if present. The steps of FIGS. 1(a)–1(e) are applied to a silicon substrate in the above described embodiment. However, the same steps can be applied to a compound semiconductor substrate such as GaAs or InP.

Figure 3A:
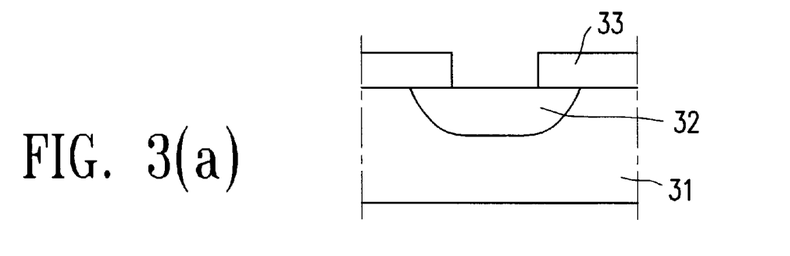
FIGS. 3(a)–3(d), FIGS. 4(a)–4(d), FIGS. 5(a)–5(d), FIGS. 6(a)–6(c), FIGS. 7(a)–7(d) and FIGS. 8(a)–8(e) are sectional diagrams illustrative of different step sequences, respectively, of the method for producing a semiconductor device according to the invention.
Figure 3B:
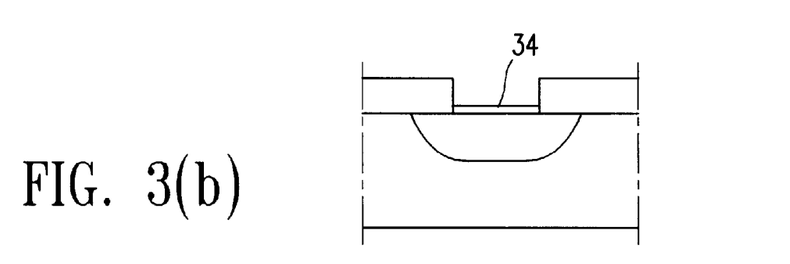
Figure 3C:
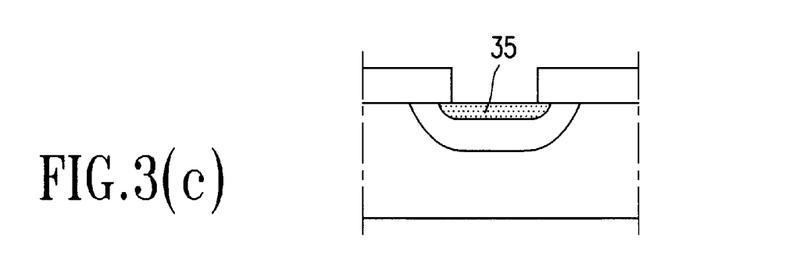
Figure 3D:
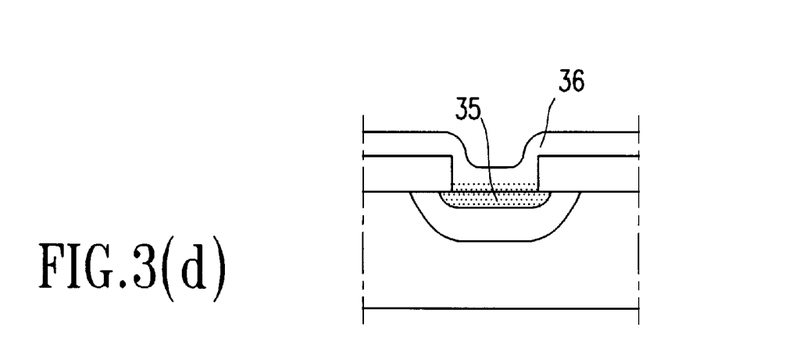
Figure 4A:
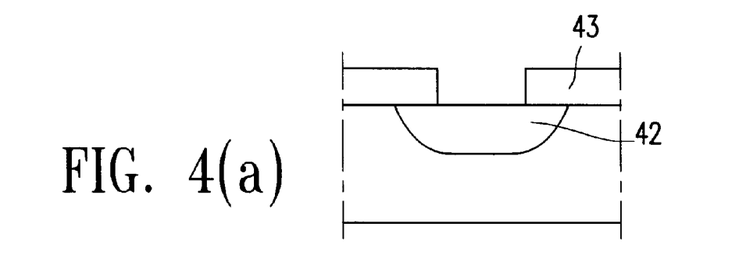
Figure 4B:
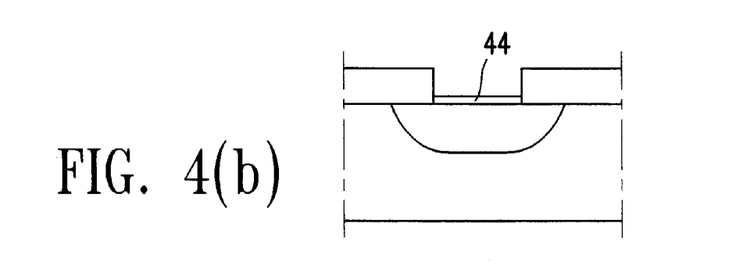
Figure 4C:
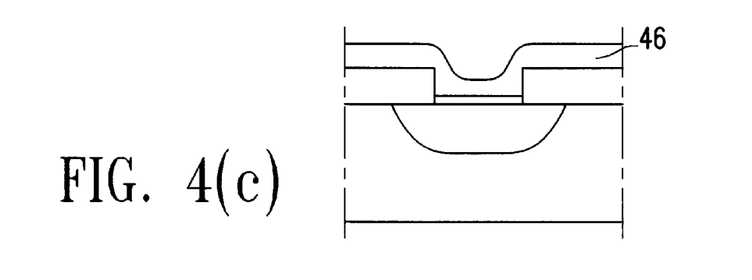
Figure 4D:
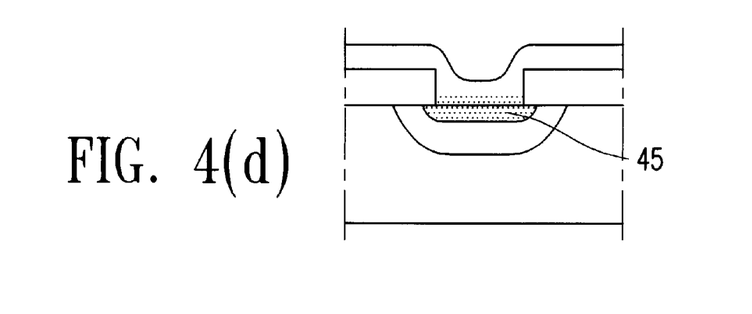
Figure 5A:
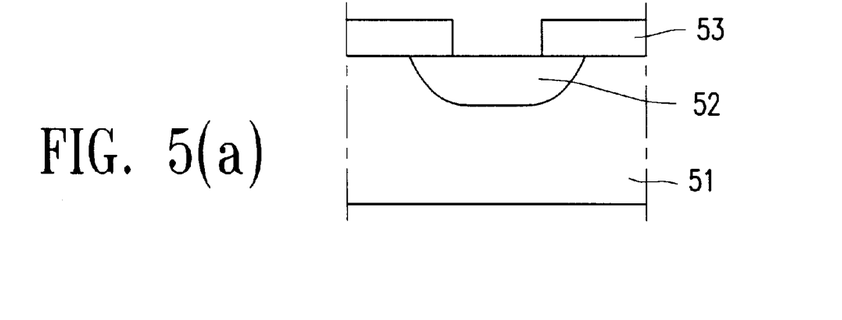
Figure 5B:
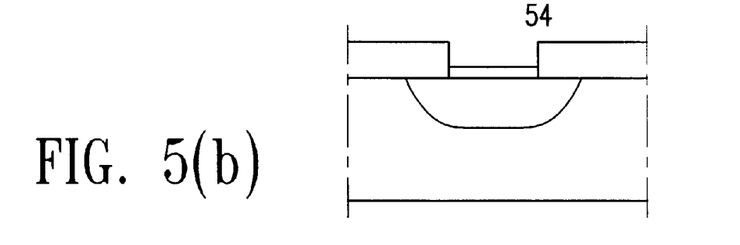
Figure 5C:
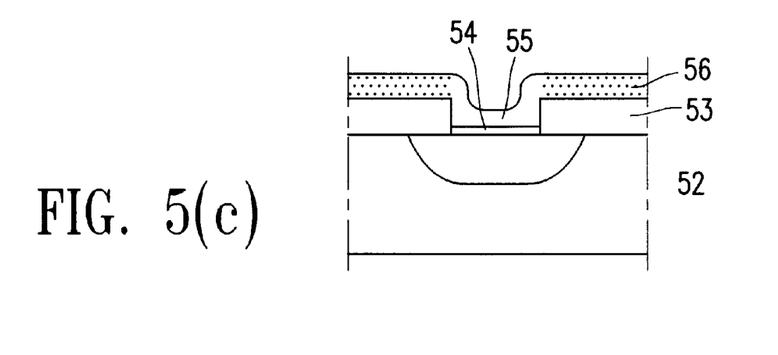
Figure 5D:
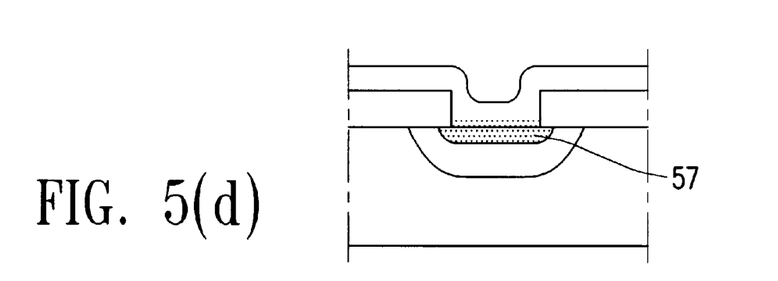

FIGS. 3(a)–3(d) show another embodiment in which an impurity diffusion region 32 is formed in a major surface of a semiconductor substrate 31, then an insulating film 33 is superposed and patterned to define a contact hole, thereafter an impurity adsorption film 34 is formed in the contact hole, and lastly the contact hole is filled with a lead pattern layer 36 composed, for example, of metal silicide. In the FIG. 3(a) step, the impurity diffusion region 32 (which may be of a well region) is partly exposed in manner similar to the first embodiment. In the step of FIG. 3(b), the impurity adsorption film 34 is formed on an activated or cleaned surface of the impurity diffusion region 32. In the FIG. 3(c) step, an annealing process is carried out to effect solid-phase doping using the impurity adsorption film 34 as a dopant source to thereby form an impurity doped region 35. In the step of FIG. 3(d), the metal silicide layer 36 of the lead pattern layer is deposited over the substrate to form electrical contact with the impurity-doped region 35 through the contact hole.

FIGS. 4(a)–4(d) show a modification of the FIGS. 3(a)–3(d) process. The FIGS. 4(a)–4(d) method is different from the FIGS. 3(a)–3(d) method in that a metal silicide layer 46 is formed immediately after the formation of an impurity adsorption film 44, and then annealing is carried out to form an impurity-doped region 45.

FIGS. 5(a)–5(d) show an embodiment where a lead pattern layer is composed of a semiconductor film. The FIG. 5(a) step and FIG. 5(b) step are identical to the FIG. 3(a) step and FIG. 3(b) step, respectively. In the FIG. 5(c) step, a semiconductor film 55/56 added with an impurity is formed on an impurity adsorption film 54. In this case, a substrate 51 is contacted with a gas mixture containing silane($SiH_4$) and diborane($B_2H_6$) at the substrate temperature of 800–1000° C. to thereby form the epitaxial film 55 of $P^+$ type on an impurity diffusion region 52 and concurrently to form the polysilicon film 56 on an insulating film 53 so as to constitute a lead pattern layer. Thereafter in the FIG. 5(d) step, an annealing processing is carried out to form an impurity-doped region 57 to further reduce contact resistance.

Figure 6A:
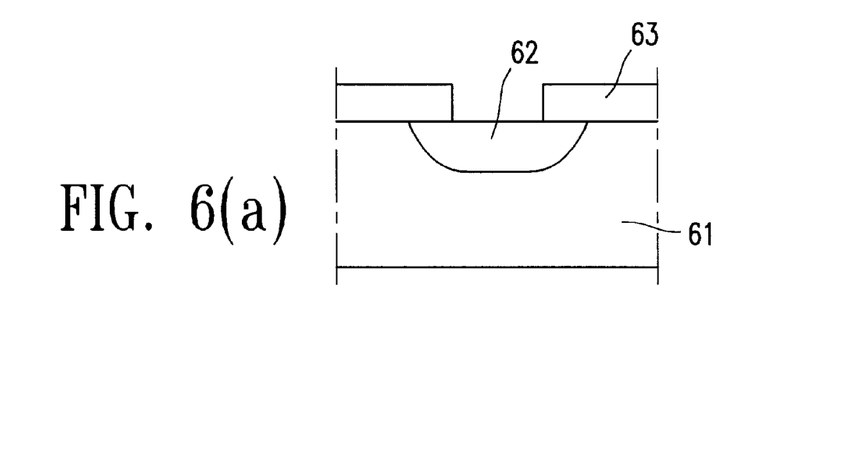
Figure 6B:
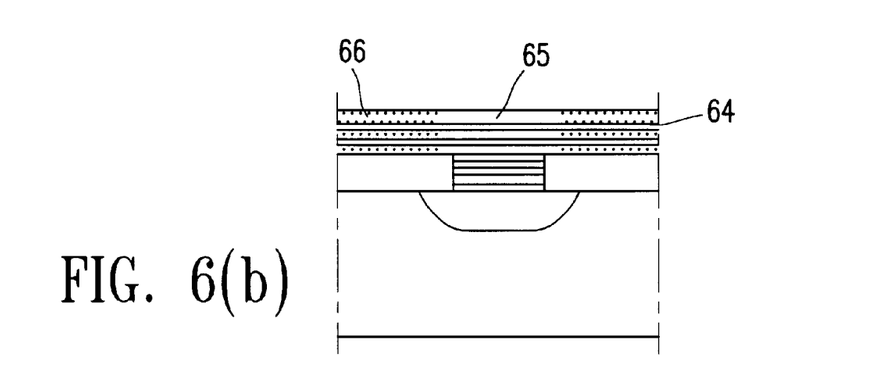
Figure 6C:
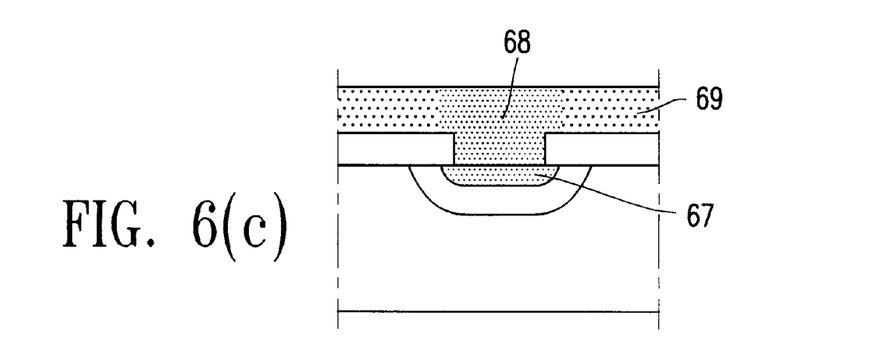
Figure 7A:
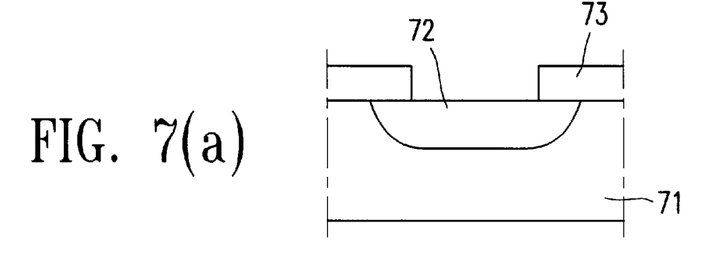
Figure 7B:
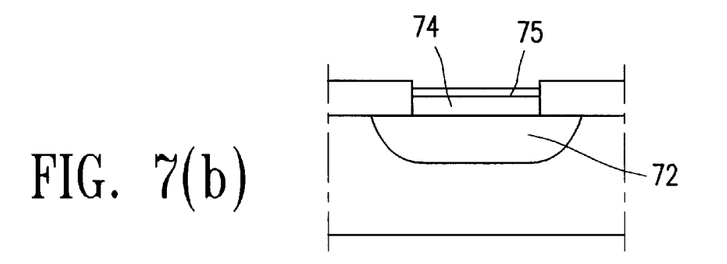
Figure 7C:
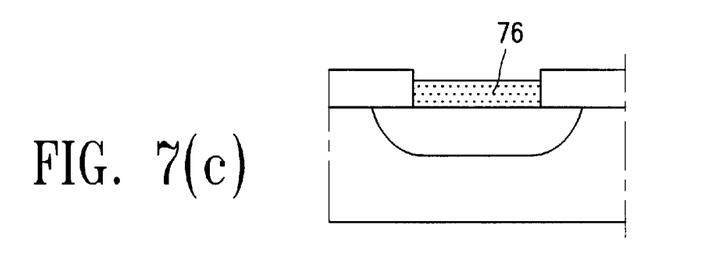
Figure 7D:
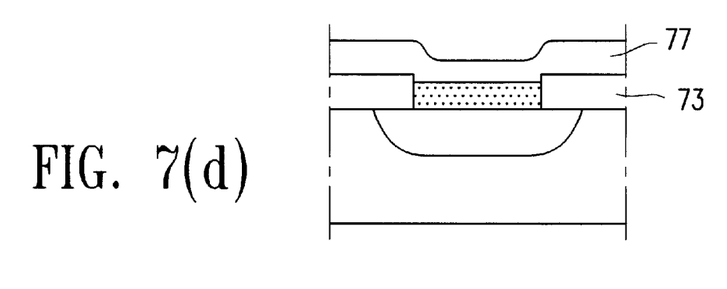
Figure 8A:
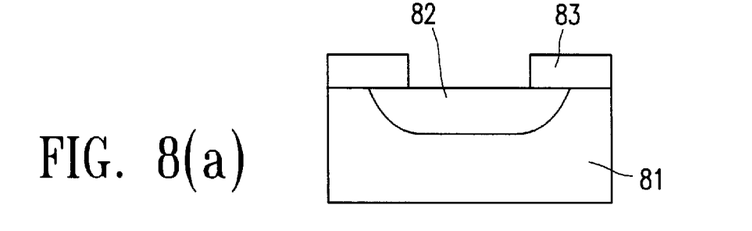
Figure 8B:
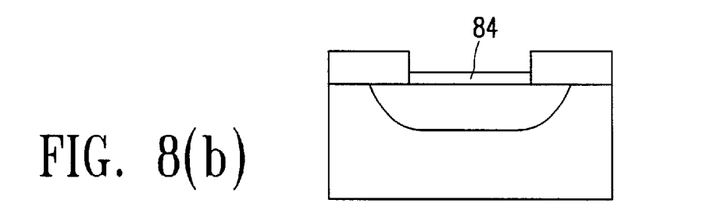
Figure 8C:
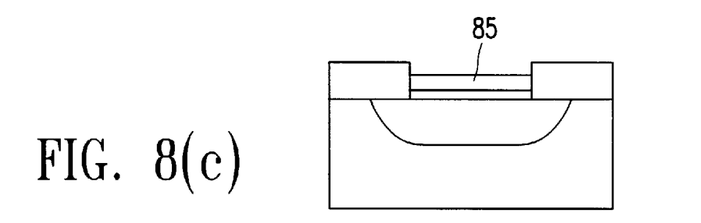
Figure 8D:
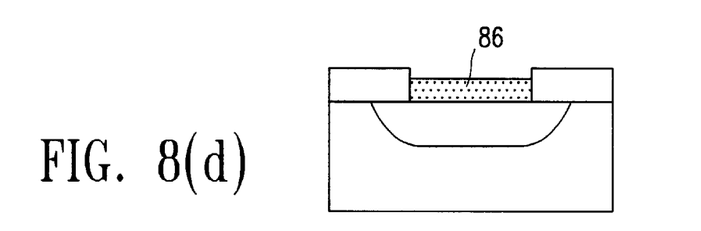
Figure 8E:
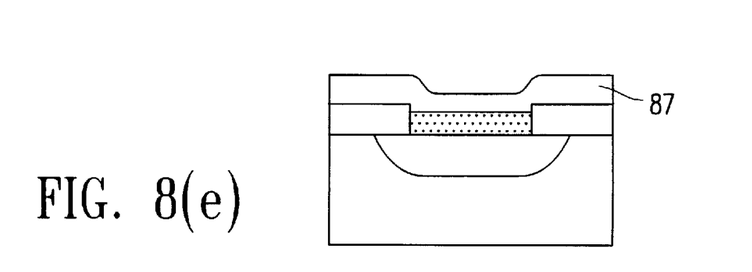

FIGS. 6(a)–6(c) show an embodiment where a lead pattern layer is also composed of a semiconductor film. In this embodiment, and impurity adsorption film 64 and a semiconductor film 65/66 are superposed with one another. In the FIG. 6(a) step, an exposed part of a semiconductor substrate 61 is activated or cleaned. Then in the FIG. 6(b) step, the adsorption film 64 containing boron impurity and the semiconductor film 65/66 are sequentially and alternately superposed on the exposed part. Thereafter, in the FIG. 6(c) step annealing processing is carried out to activate boron in the silicon semiconductor film to provide a lead pattern layer. In this case, as similar to the steps shown in FIGS. 5(a)–5(d), the $P^+$ type epitaxial film 65 is formed over the impurity diffusion region 62 and concurrently the $P^+$ type polysilicon film 66 is formed over the insulating film 63.

FIGS. 7(a)–7(d) shown an embodiment where an additional layer composed of an impurity adsorption film and a semiconductor film is utilized as a buffer layer between a semiconductor substrate and a lead pattern layer. In this case, a layer of the lead pattern is composed, for example, of a high-melting-temperature metal silicide typically such as tungsten silicide. In the method of FIGS. 7(a)–7(d), a partly exposed surface of a semiconductor substrate is activated, and thereafter a semiconductor film is selectively deposited on the partly exposed part. Further, an impurity adsorption film is provided on the semiconductor film to thereby form a buffer layer. In the FIG. 7(a) step, a natural oxide film is removed from a surface of an impurity diffusion region 72. In the FIG. 7(b) step, the semiconductor film 74 is selectively formed only on the activated surface of the impurity diffusion region 72 by using a dichlorosilane gas($SiH_2Cl_2$) and a hydrogen gas ($H_2$). Further, the impurity adsorption film 75 is formed on the semiconductor film 74. The semiconductor film 74 may be formed from the above mentioned gas mixture added with a diborane gas ($B_2H_6$) to further reduce resistivity of the semiconductor film. Next in the FIG. 7(c) step, annealing is carried out to uniformly distribute impurity to form the buffer layer 76. Lastly in the FIG. 7(d) step, a metal silicide layer 77 is deposited on the buffer layer 76 and on the insulating film 73 to provide a lead pattern layer.

FIGS. 8(a)–8(e) show another method which is basically identical to the method shown in FIGS. 7(a)–7(d). The FIGS. 8(a)–8(e) method is different from the FIGS. 7(a)–7(d) method in that a semiconductor film 85 is formed after depositing an impurity adsorption film 84. By utilizing these methods shown in FIGS. 7(a)–7(d) and FIGS. 8(a)–8(e), not only contact resistance can be reduced between the metal silicide layer and the semiconductor substrate, but also the step height in the contact hole can be reduced to thereby effectively avoid opening of the lead pattern layer around an edge of the insulating film. In these embodiments, an impurity adsorption film is separately formed; however, the separate formation of adsorption film can be eliminated by forming a semiconductor film while simultaneously adding thereto the impurity at a high density level.

As described above, according to the invention, the surface concentration of impurity can be increased on the impurity diffusion region so as to reduce contact resistance with respect to the lead pattern layer. In case that thermal processing is carried out at a high temperature after the formation of the lead pattern layer, even when the impurity is reversely diffused from the impurity diffusion region into the lead pattern layer, since the impurity diffusion region has a sufficiently high initial surface concentration, a practically low contact resistance can be maintained. Further, the doping depth of the impurity diffusion region can be properly controlled within the contact hole so as to avoid alloy spike caused in an aluminum lead pattern layer.

Figure 9:
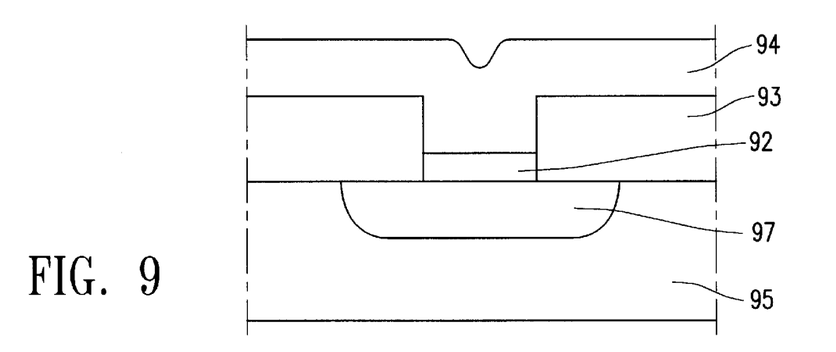
FIG. 9 is structural sectional view showing one embodiment of the inventive contact hole structure.

Lastly, FIG. 9 is a structural sectional diagram showing one embodiment of the inventive contact structure of an insulating gate field effect transistor device. A $P^+$ type silicon region 97 is formed in a surface of an Si substrate 95 by ion implantation of boron to define a source or drain region. Thereafter, a field insulating film 93 is formed of $SiC_2$ on the substrate 95 and a contact hole is opened in the insulating film 93. A $P^+$ type silicon single crystal thin film 92 and a metal electrode 94 are sequentially formed in the contact hole. The $P^+$ type silicon single crystal thin film 92 is formed by atmospheric pressure CVD, reduced pressure CVD or MBE (molecular beam epitaxy). In this case, selective growth is carried out through a mask composed of the $SiO_2$ field insulating film 93 by atmospheric or reduced pressure CVD using Si—H—Cl system. However, molecular layer epitaxy (MLE) may be more effective to control the thickness of the selective growth of the $P^+$ type silicon single crystal thin film. As described above, the inventive semiconductor device is constructed such that the metal electrode 94 and the $P^+$ type silicon region 97 are electrically contacted to each other through the $P^+$ type silicon single crystal thin film 92 formed in the contact hole over the $P^+$ type silicon region 97.

According to the invention, the contact resistance can be significantly reduced as compared to the conventional contact structure between the low resistivity semiconductor region and the metal lead pattern layer. Further, the step height of a contact hole can be reduced to thereby greatly facilitate microminiaturization of a transistor without affecting the contact resistance.

The application relates to subject matter disclosed in Japanese Application Numbers 1-194748, 1-194752 and 1-318551, filed on Jul. 27, 1989, the disclosure of which is incorporated herein by reference.

While the description above refers to particular embodiments of the present invention, it will be understood that may modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of producing a semiconductor device, comprising:
   a) forming an impurity diffusion region having a conductivity type in a surface of a semiconductor substrate;
   b) forming an insulating film on the surface of the substrate so that the insulating film covers at least part of the impurity diffusion region;
   c) forming a photoresist film on the insulating film;
   d) patterning the photoresist film to provide the photoresist film with an opening above the impurity diffusion region;
   e) etching the insulating film using the patterned photoresist film as a mask to form a contact hole in the insulating film at the location of the opening in order to expose a part of the impurity diffusion region;
   f) removing the patterned photoresist film;
   g) removing a natural oxide film from a surface of the impurity diffusion region in the contact hole by reducing with a reactive gas at an ambient temperature of 600–1000° C. so as to effect gas-phase etching to activate an exposed surface of the impurity diffusion region;
   h) applying a gas containing an impurity component which has same conductivity type as that of the impurity diffusion region to the surface of semiconductor substrate and heating the semiconductor substrate at a temperature of 600–900° C. to form an impurity film which contains the impurity component and is adsorbed on the activated exposed surface of the impurity diffusion region and in the contact hole;
   i) annealing the impurity diffusion region and the impurity film to diffuse the impurity component from the impurity film to a depth into the impurity diffusion region; and
   j) filling the contact hole with an electrically conductive layer to produce electrical contact between the impurity diffusion region and the electrically conductive layer via the impurity film.

2. A method as defined in claim 1, wherein the steps of annealing the impurity diffusion region and filling the contact hole with an electrically conductive layer are carried out by the steps of:
   k) forming a semiconductor film on the impurity film in the contact hole;
   l) repeating steps h) and k) to fill the contact hole with successive, alternating impurity films and semiconductor films; and
   m) annealing the impurity diffusion region, the impurity films and the semiconductor films to diffuse the impurity component from at least the first-formed impurity film to a depth into the impurity diffusion region and to convert a plurality of the impurity films and the semiconductor films into an impurity doped layer.

3. A method of producing a semiconductor device, comprising:
   a) forming an impurity diffusion region having a conductivity type in a surface of a semiconductor substrate;
   b) forming an insulating film on the surface of the substrate so that the insulating film covers at least part of the impurity diffusion region;
   c) forming a photoresist film on the insulating film;
   d) patterning the photoresist film to provide the photoresist film with an opening above the impurity diffusion region;

e) etching the insulating film using the patterned photoresist film as a mask to form a contact hole in the insulating film at the location of the opening in order to expose a part of the impurity diffusion region;

f) removing the patterned photoresist film;

g) removing a natural oxide film from a surface of the impurity diffusion region in the contact hole by reducing with a reactive gas at an ambient temperature of 600–1000° C. so as to effect gas-phase etching to activate an exposed surface of the impurity diffusion region;

h) applying a gas containing an impurity component which has the same conductivity type as that of the impurity diffusion region to the surface of the semiconductor substrate and heating the semiconductor substrate at a temperature of 600–900° C. to form an impurity film which contains the impurity component and is adsorbed on the activated exposed surface of the impurity diffusion region and in the contact hole;

i) forming a semiconductor film on the impurity film in the contact hole;

j) annealing the impurity diffusion region, the impurity film and the semiconductor film to diffuse the impurity component from the impurity film to a depth into the impurity diffusion region and to convert the impurity film and the semiconductor film into an impurity doped layer; and k) filling the contact hole with an electrically conductive layer to produce electrical contact between the impurity diffusion region and the electrically conductive layer via the impurity doped layer.

4. A method of producing a semiconductor device comprising:

a) forming an impurity diffusion region having a conductivity type in a surface of a semiconductor substrate;

b) forming an insulating film on the surface of the substrate so that the insulating film covers at least part of the impurity diffusion region;

c) forming a photoresist film on the insulating film;

d) patterning the photoresist film to provide the photoresist film with an opening above the impurity diffusion region;

e) etching the insulating film using the patterned photoresist film as a mask to form a contact hole in the insulating film at the location of the opening in order to expose a part of the impurity diffusion region;

f) removing the patterned photoresist film;

g) removing a natural oxide film from a surface of the impurity diffusion region in the contact hole by reducing with a reactive gas at an ambient temperature of 600–1000° C. so as to effect gas-phase etching to activate an exposed surface of the impurity diffusion region;

h) forming a semiconductor film in the contact hole on the exposed part of the impurity diffusion region;

i) applying a gas containing an impurity component which has same conductivity type as that of the impurity diffusion region to the surface of semiconductor substrate and heating the semiconductor substrate at a temperature of 600–900° C. to form an impurity film which contains the impurity component and is adsorbed on the semiconductor film and in the contact hole;

j) annealing the impurity diffusion region, the impurity film and the semiconductor film to diffuse the impurity component to a depth from the impurity film into the impurity diffusion region and to convert the impurity film and the semiconductor film into an impurity doped layer; and k) filling the contact hole with an electrically conductive layer to produce electrical contact between the impurity diffusion region and the electrically conductive layer via the impurity doped layer.

5. A method as defined in claim 1, wherein the impurity component is boron.

6. A method as defined in claim 3, wherein the impurity component is boron.

7. A method as defined in claim 4, wherein the impurity component is boron.

* * * * *